United States Patent
Klebanoff et al.

(10) Patent No.: US 6,888,297 B2
(45) Date of Patent: May 3, 2005

(54) METHOD AND APPARATUS FOR DEBRIS MITIGATION FOR AN ELECTRICAL DISCHARGE SOURCE

(75) Inventors: Leonard E. Klebanoff, San Clemente, CA (US); William T. Silfvast, St. Helena, CA (US); Daniel J. Rader, Albuquerque, NM (US)

(73) Assignee: EUV LLC, Santa Clara, CA (US)

( * ) Notice: Subject to any disclaimer, the term of this patent is extended or adjusted under 35 U.S.C. 154(b) by 203 days.

(21) Appl. No.: 10/325,997

(22) Filed: Dec. 19, 2002

(65) Prior Publication Data

US 2004/0119394 A1 Jun. 24, 2004

(51) Int. Cl.[7] ............................. H01J 61/04; G21G 4/00
(52) U.S. Cl. ...................... 313/356; 313/618; 313/631; 313/632; 313/634; 250/504 R; 250/493.1; 378/119
(58) Field of Search ................................ 313/356, 618, 313/631–634; 250/504 R, 493, 493.1, 492.2; 378/119

(56) References Cited

U.S. PATENT DOCUMENTS

| | | | | | |
|---|---|---|---|---|---|
| 6,031,241 A | * | 2/2000 | Silfvast et al. | .......... | 250/504 R |
| 6,072,157 A | * | 6/2000 | Klebanoff et al. | .......... | 219/228 |
| 6,153,044 A | * | 11/2000 | Klebanoff et al. | ....... | 156/345.3 |
| 6,232,613 B1 | * | 5/2001 | Silfvast et al. | .......... | 250/504 R |
| 6,452,199 B1 | * | 9/2002 | Partlo et al. | ............ | 250/504 R |
| 2004/0099820 A1 | * | 5/2004 | Bristol | ..................... | 250/493.1 |

* cited by examiner

*Primary Examiner*—Nimeshkumar D. Patel
*Assistant Examiner*—Sikha Roy
(74) *Attorney, Agent, or Firm*—Donald A. Nissen

(57) ABSTRACT

Method and apparatus for mitigating the transport of debris generated and dispersed from electric discharge sources by thermophoretic and electrostatic deposition. A member is positioned adjacent the front electrode of an electric discharge source and used to establish a temperature difference between it and the front electrode. By flowing a gas between the member and the front electrode a temperature gradient is established that can be used for thermophoretic deposition of particulate debris on either the member or front electrode depending upon the direction of the thermal gradient. Establishing an electric field between the member and front electrode can aid in particle deposition by electrostatic deposition.

10 Claims, 3 Drawing Sheets

METHOD AND APPARATUS FOR DEBRIS MITIGATION FOR AN ELECTRICAL DISCHARGE SOURCE

STATEMENT OF GOVERNMENT INTEREST

This invention was made with Government support under contract no. DE-AC04-94AL85000 awarded by the U.S. Department of Energy to Sandia Corporation. The Government has certain rights in the invention.

CROSS-REFERENCE TO RELATED APPLICATIONS

Not applicable.

FIELD OF THE INVENTION

The present invention pertains generally to method and apparatus for mitigating the transport of debris generated and dispersed by electrical discharge sources used, in particular, for generating extreme ultraviolet radiation by the use of thermophoretic and electrostatic deflection and deposition.

BACKGROUND OF THE INVENTION

Photolithography is a well-known technique for applying patterns to the surface of a workpiece, such as a circuit pattern to a semiconductor chip or wafer. This technique has the advantage of being able to faithfully reproduce small and intricate patterns. Traditional photolithography involves applying electromagnetic radiation (light) to a mask having openings formed therein (transmission mask) such that the light that passes through the openings is applied to a region on the surface of the workpiece that is coated with a radiation-sensitive substance, e.g., a photoresist. The mask pattern is reproduced on the surface of the workpiece by removing either the exposed or unexposed photoresist. The capabilities of conventional photolithographic techniques have been severely challenged by the need for circuitry of increasing density requiring higher resolution features. This is particularly true for advanced or next generation lithography where the goal is to produce circuits whose critical dimensions are below 0.1 $\mu$m. The demand for smaller feature sizes has inexorably driven the wavelength of radiation needed to produce the desired pattern to ever-shorter wavelengths, i.e., toward extreme ultraviolet (EUV) or soft x-ray radiation. Two frequently used sources of such radiation are a laser-produced plasma (LPP) and synchrotron radiation. Laser plasma sources are as bright as their more expensive synchrotron counterparts and are better suited to a small laboratory or commercial environment. The plasma, produced by directing a laser at a target composed of a condensed gas such as krypton or xenon, as it expands through a supersonic nozzle into a vacuum chamber, has been shown to produce a stable source of extreme ultraviolet (EUV) radiation, i.e., light whose wavelength in the range 3.5–15 nm. The generation of EUV radiation by means of a LPP has been described in U.S. Pat. No. 5,577,092 "Cluster Beam Targets for Laser Plasma Extreme Ultraviolet and Soft X-rays". Thus, a laser produced plasma (LPP) is well suited for producing the EUV radiation required for next-generation lithography tools and the use of a LPP for EUV lithography has been described in U.S. Pat. No. 6,031,598 "Extreme Ultraviolet Lithography Machine".

While generation of EUV radiation by means of a LPP reduces or eliminates many of the problems associated with other sources of EUV radiation, such as production of damaging atomic and particulate debris, there are still significant problems associated with LPP radiation generation. Chief among these is the cost, primarily driven by the cost of the laser diodes required to pump the lasers. Moreover, the laser pump poses severe technological problems.

In an attempt to overcome the difficulties associated with LPP radiation sources, Silfvast, in U.S. Pat. No. 5,499,282 "Efficient Narrow Spectral Width Soft X-ray Discharge Source", describes a pulsed electrical capillary discharge source. The electrical discharge source employs a pulsed high voltage, high current electric discharge in a low pressure gas to excite a plasma confined within a capillary bore region. Any gas that can be ionized to generate a plasma that produces radiation at the appropriate wavelength can be used. For generating EUV radiation and soft x-rays xenon is the most desirable species.

FIG. 1 is a cross-sectional view of a typical electrical discharge source 100 that comprises generally an insulating disc 110, typically fabricated from a ceramic material, having an axial capillary bore 115, a front electrode 120 and a rear electrode 130, disposed on either side of insulating disc 110, each having an aperture aligned with capillary bore 115. In operation, a gas, i.e., Xe gas, flows through capillary bore 115 from rear electrode 130 to front electrode 120. A high voltage, high current electrical pulse is established across the front and rear electrodes by power supply 140 causing electrons in the gas to be accelerated and to collide with and excite gaseous atoms causing them to emit radiation. In the case of Xe gas the radiation is extreme ultraviolet (EUV) radiation at about 13.5 nm. However, this discharge source ejects significant amounts of debris eroded from the capillary bore and electrodes.

The intense plasma generated in the capillary bore tends to heat the capillary walls and, depending upon the material used, causes the surface of the capillary bore either to vaporize or to repeatedly melt and solidify. Furthermore, significant stresses are introduced near the surface of the capillary bore by the intense thermal gradients generated during the discharge cycle. The combination of these stresses and changes in the physical state of the capillary bore surface cause material to break away from the surface and generate debris. It is this debris that can coat and erode the surface of proximate optical components used to collect EUV light, thereby severely affecting their reflectance and reducing their efficiency.

Debris generation remains one of the most significant impediments to the successful development of electrical capillary discharge sources for EUV lithography and various modifications of the basic electrical discharge source design have been proposed to block debris from reaching critical optical features. As illustrated in FIG. 2, these prior art modifications generally employ physical means, such as reconfiguration of front electrode 120. While providing a direct blocking path for debris travel, debris emitted in an angular distribution from the capillary can still escape. Moreover, these modifications also intercept a significant portion of the generated EUV radiation, permitting only collection of that radiation that is emitted in an angular direction from the capillary.

SUMMARY OF THE INVENTION

Accordingly, the present invention is directed, in part, to a method and apparatus for mitigating the transport of debris generated and dispersed by an electrical discharge source. The method is based on the use of thermophoretic and electrostatic deposition to prevent both charged and neutral particles from leaving the capillary discharge source and depositing onto proximate collection optics degrading their efficiency.

BRIEF DESCRIPTION OF THE DRAWINGS

In the drawings, like elements with like functions are referred to by like numbers.

DETAILED DESCRIPTION OF THE INVENTION

The present invention is directed to an improved electrical capillary discharge source, wherein the improvement provides for trapping of debris generated by the capillary discharge source by thermophoretic and electrostatic deposition.

Figure 1:
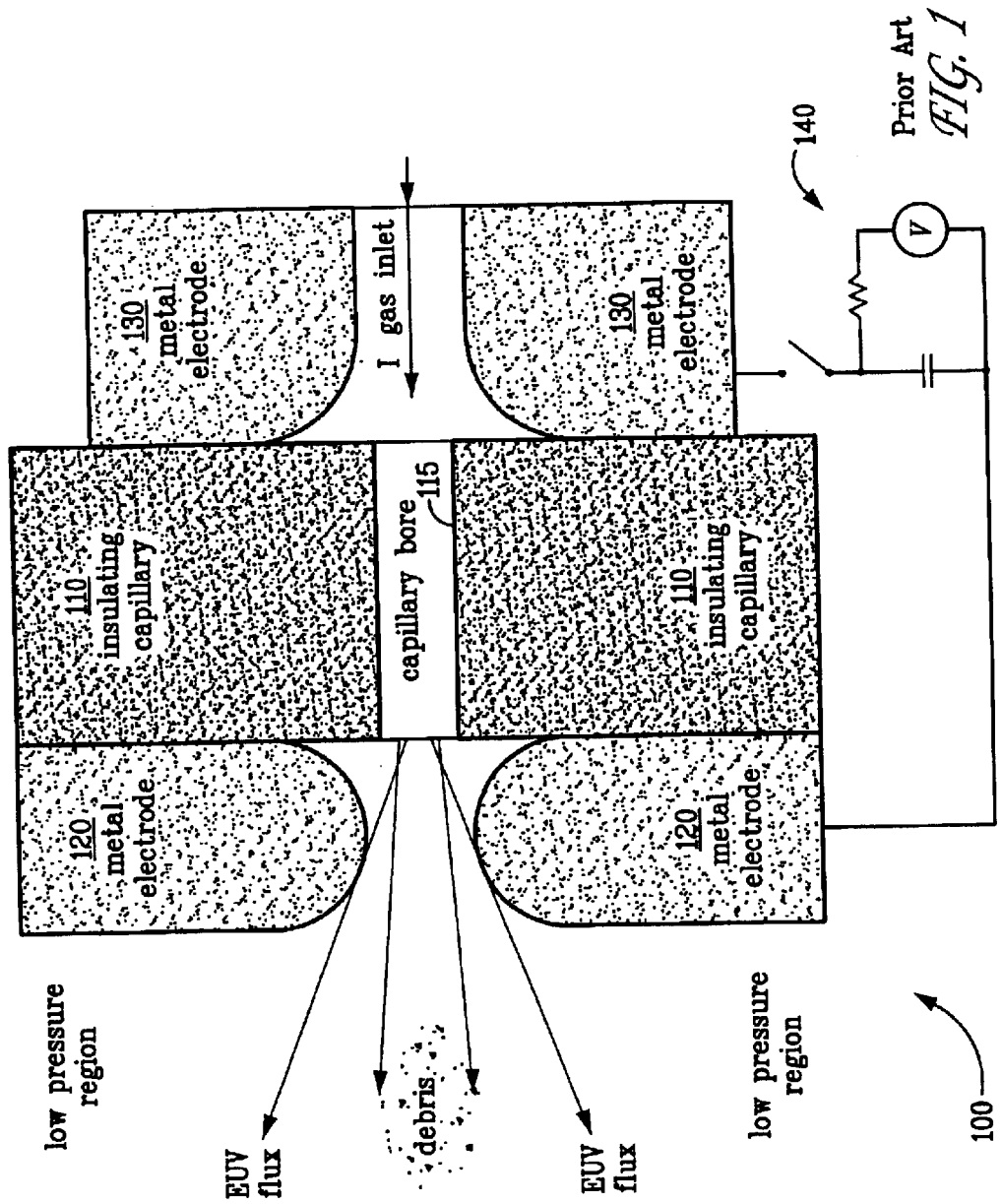
FIG. 1 is a schematic illustration of a generalized prior art electrical capillary discharge source.
Figure 2:
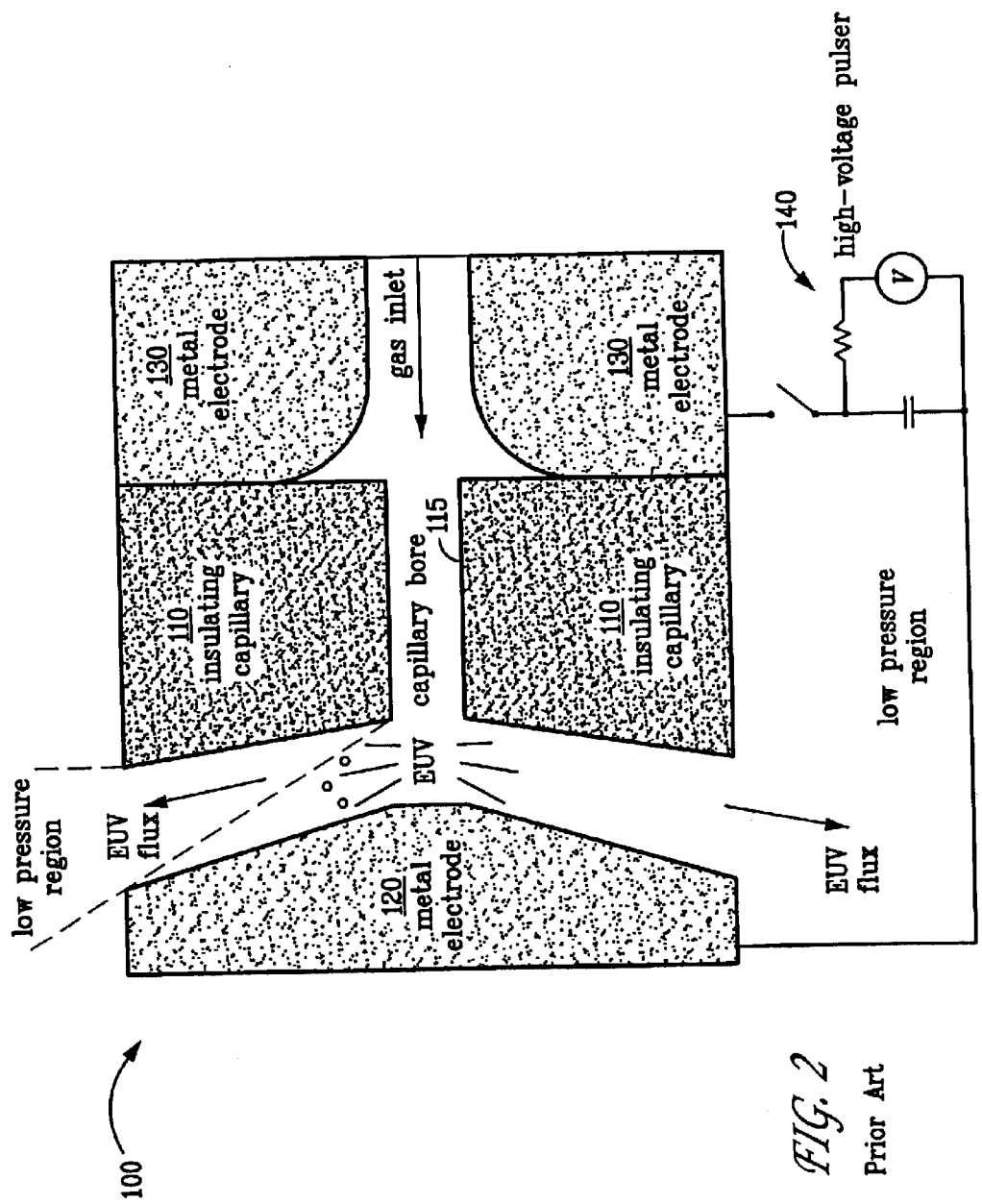
FIG. 2 shows a modification of a prior art electrical discharge source.
Figure 3:
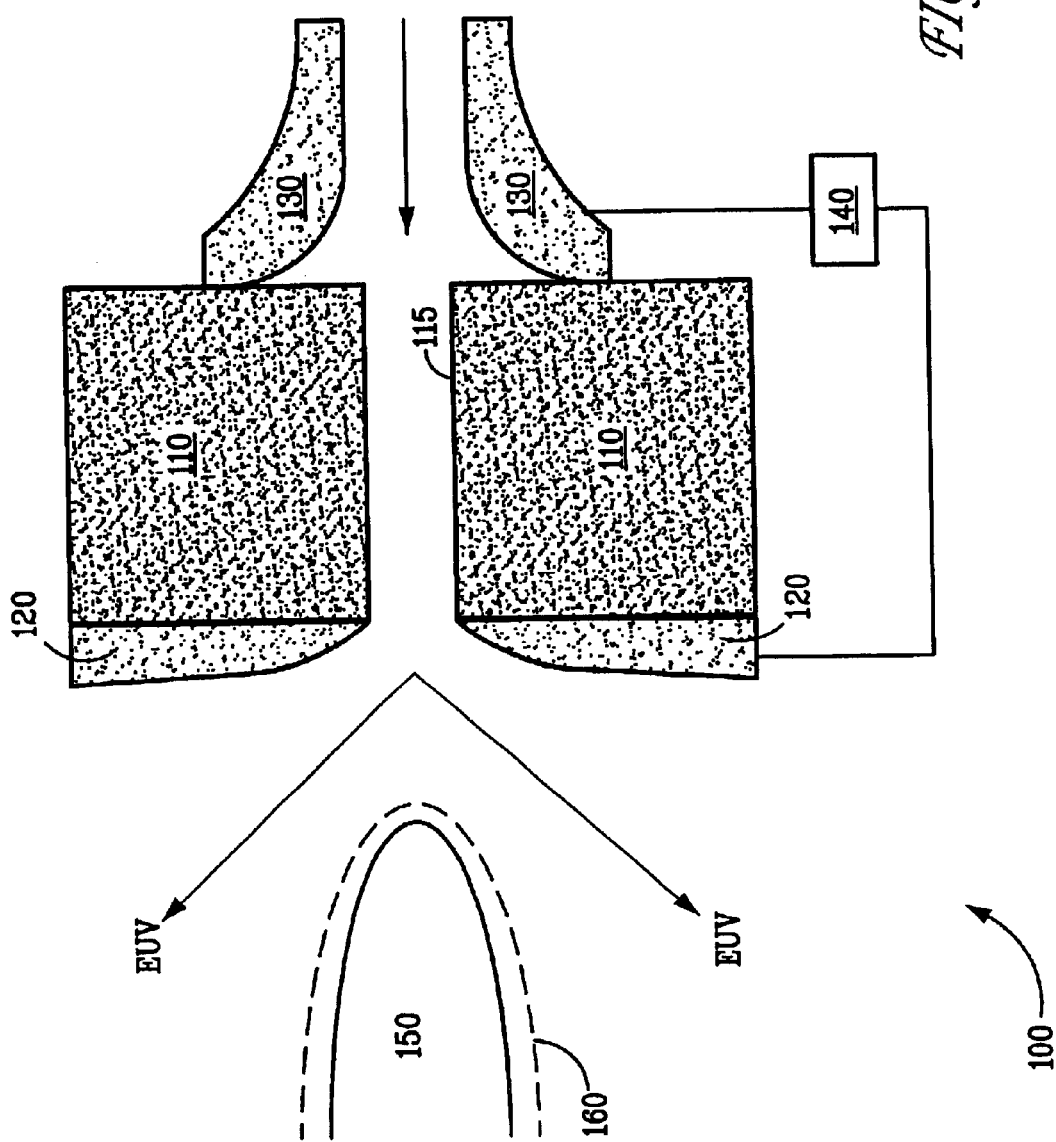
FIG. 3 is a schematic embodiment of the present invention.

Referring now to FIG. 3 which illustrates a schematic cross-sectional view of an embodiment of the electrical capillary discharge source 100. As in the prior art discharge source illustrated in FIG. 1, the present electrical discharge source comprises an insulating disc 110, typically fabricated from an electrical insulator material such as a ceramic material, having an axial capillary bore 115, a front electrode 120 and a rear electrode 130, disposed on either side of insulating disc 110, each having an aperture aligned with capillary bore 115. Xenon gas flows through capillary bore 115 from rear electrode 130 to front electrode 120. A high voltage, high current electrical pulse is established across the front and rear electrodes by a source of electric potential 140, such as a power supply capable of generating pulses. Typically, the gas pressure near the rear electrode is about 1–20 Torr while at the front electrode it is in the range of about 1–50 mTorr. The lower gas pressure in the region of the endcone is desirable to reduce EUV absorption by residual gas.

An endcone 150, comprising a conical-shaped surface of rotation subtending an angle of about 20° to 30° from the axial line of capillary 115 in order to avoid blocking more than a small solid angle of the radiation emitted from the discharge source, is disposed proximate front electrode 120 and on the axial line of capillary 115. The endcone can be heated to a temperature higher than that of the front electrode and capillary to produce a temperature difference between the endcone and the proximate front electrode. Xenon gas flowing in the space between endcone 150 and front electrode 120 at a pressure of about 1–50 mTorr can support a temperature gradient, thereby creating a thermophoretic force that will push debris particles away from the hot region (endcone) and toward the cooler front electrode. Alternatively, the endcone can be maintained at a temperature below that of front electrode 120, for example by active cooling, thereby establishing a "reverse" thermal gradient, whereby debris particles are caused to deposit onto endcone 150. The space or gap between the endcone and front electrode can be in the range of about 1–10 mm and is determined by such factors as the EUV output and the desired thermal gradient between the front electrode and endcone.

The endcone can be made of an electrically conducting material and heated by means of an electric current. Alternatively, the endcone can be made of an electrically and thermally insulating material, and preferably from a high temperature ceramic insulating material such as alumina, boron nitride, that can serve as a support member for an electrically conducting material. By affixing to the outer surface of the endcone (an electrical insulator) an electrical conductor such as a metal cone or metal mesh material 160, capable of withstanding the required high temperatures, such as Mo or W, the endcone can be heated by an electric current from a voltage source 170 to a temperature higher than that of the front electrode and capillary to produce a temperature difference between the endcone and the proximate front electrode.

In the event it is desired that thermophoretic deposition take place on the surface of the endcone, the endcone can be hollow and filled with a coolant such as liquid nitrogen, thereby establishing a "reverse" thermal gradient. As before, the temperature of the surface of the endcone can be regulated by means of an electric current applied to the endcone.

Thermophoretic forces operate to cause particles in a gas to be driven from regions of higher gas temperature to regions of lower gas temperature. Thermophoresis can be a useful tool to overcome particle deposition onto surfaces because it is capable of overwhelming those mechanisms that lead to particle deposition such as: 1) electrostatic forces, 2) inertia, 3) Brownian motion, and 4) gravity. There are two critical features associated with thermophoresis generally: 1) a temperature gradient must be developed in the gas resident between two surfaces to cause a thermophoretic force to be developed, and 2) the gas pressure must be sufficiently high to enable sufficient collisions between gas molecules and particles to develop a thermophoretic force. Thus, while thermophoresis vanishes in a perfect vacuum, pressures above about 100 mTorr are sufficient to establish, in most gases, a well defined temperature gradient, however, useful thermophoretic protection can be established at pressures as low as 1 mTorr, although with a lowered effectiveness. A general discussion of thermophoretic forces and their use to protect critical surfaces can be found in U.S. Pat. No. 6,253,464 "Method for Protection of Lithographic Components from Particle Contamination".

Thermophoresis will act on charged as well as neutral particles. By allowing the endcone to electrically float to either positive or negative voltages an electric field can be established between endcone 150 and front electrode 120. Thus, in addition to removing debris particles by thermophoresis, the electric field will enhance removal of charged particles from the gas stream exiting the capillary bore of the discharge source by electrostatic attraction.

The following embodiment is provided as an illustration of the operation of the invention. However, this invention may be embodied in many different forms and should not be construed as limited only to the embodiments set forth herein but as defined by the appended claims.

In the electrical discharge source illustrated in FIG. 3 a separation between the endcone and front electrode of about 5 mm was established. During source operation, front electrode 120 is generally at a temperature of about 1500° C. To capture as many debris particles as possible, a temperature gradient of about 400° C./mm was established between the endcone and the front electrode. Consequently, the endcone was maintained at a temperature of about 1700° C. by passing an electric current through mesh 160. A gas pressure in the range of about 10–100 mTorr was maintained between the front electrode and endcone during source operation.

With a 5 mm gap between the endcone and front electrode, Paschen's Law provides that a voltage difference of about 1 kV can be supported before electrical breakdown of the intervening Xe gas would take place. Thus, very effective electrostatic particle deposition can be achieved by providing voltage differences as small as 100 V.

In summary, a method and apparatus are disclosed that uses both thermophoresis and electrostatic deposition to mitigate particulate dispersal from an electric discharge source.

We claim:

1. An electrical discharge source comprising:

an electrically insulating body defining a capillary bore having an inlet and outlet;

a first electrode defining a channel having an inlet connected to a source of gas and an outlet in communication with the inlet of the capillary bore;

a second electrode defining a channel in communication with the outlet of the capillary bore;

an endcone disposed proximate said second electrode and on the axial line of the capillary bore, wherein the endcone is maintained at a temperature different from that of said second electrode; and a source of electric potential for generating electrical pulses.

2. The discharge source of claim 1, wherein the gas is at a pressure of at least 1 mTorr.

3. The discharge source of claim 2, wherein the gas is xenon gas.

4. The discharge source of claim 1, wherein said endcone comprises a material that is an electrical and thermal insulator.

5. The discharge source of claim 4, wherein the insulator includes alumina or boron nitride.

6. The discharge source of claim 4, further including an electrical conductor affixed to the outer surface of said endcone.

7. The discharge source of claim 6, wherein the electrical conductor comprises a metal mesh material.

8. The discharge source of claim 7, wherein the metal mesh material is W or Mo.

9. The discharge source of claim 1, wherein the spacing between said endcone and said second electrode is between about 1 to 10 mm.

10. The discharge source of claim 1, wherein said endcone is configured to provide an electrical field between said endcone and said electrode.

* * * * *